United States Patent [19]

Yarbrough et al.

[11] Patent Number: 4,700,132
[45] Date of Patent: Oct. 13, 1987

[54] INTEGRATED CIRCUIT TEST SITE

[75] Inventors: Thomas R. Yarbrough, Austin; Larry M. Beasley, Round Rock, both of Tex.

[73] Assignee: Motorola, Inc., Schaumburg, Ill.

[21] Appl. No.: 731,194

[22] Filed: May 6, 1985

[51] Int. Cl.[4] .......................................... G01R 31/02
[52] U.S. Cl. ......................... 324/158 F; 324/73 PC; 324/158 P
[58] Field of Search .......... 324/158 F, 158 P, 73 PC, 324/72.5; 339/108 TP, 17 LM, 17 M

[56] References Cited

U.S. PATENT DOCUMENTS

| | | | |
|---|---|---|---|
| 3,701,964 | 10/1972 | Cronin | 339/17 M |
| 4,061,969 | 12/1977 | Dean | 324/73 PC X |
| 4,115,735 | 9/1978 | Stanford | 324/158 F |
| 4,352,061 | 9/1982 | Matrone | 324/158 F |
| 4,438,397 | 3/1984 | Katz | 324/72.5 X |
| 4,477,774 | 10/1984 | Revirieux | 324/158 P |
| 4,504,783 | 3/1985 | Zasio et al. | 324/158 F X |
| 4,508,405 | 4/1985 | Damon et al. | 324/158 F X |
| 4,573,009 | 2/1986 | Fowler et al. | 324/158 F |

FOREIGN PATENT DOCUMENTS

| | | | |
|---|---|---|---|
| 3300247 | 7/1983 | Fed. Rep. of Germany | 324/158 P |
| 0137773 | 8/1983 | Japan | 324/158 F |

*Primary Examiner*—Reinhard J. Eisenzopf
*Assistant Examiner*—Vinh P. Nguyen
*Attorney, Agent, or Firm*—John A. Fisher; Jeffrey Van Myers; David L. Mossman

[57] ABSTRACT

An integrated circuit test site assembly for testing pin grid array (PGA) packaged integrated circuits having removable contact pins. The removable contact pins, which are preferably spring-loaded pogo pins, enable the test site assembly to be repaired quickly and easily with a minimum of down time. In addition, the test site need only be loaded with the number of pins required to make contact with the PGA lead pattern.

10 Claims, 2 Drawing Figures

INTEGRATED CIRCUIT TEST SITE

FIELD OF THE INVENTION

The invention relates to fixtures for use in testing packaged integrated circuits and, more particularly relates to fixtures useful in testing integrated circuits in pin grid array packages.

BACKGROUND OF THE INVENTION

In the manufacture and testing of small electronic parts, such as integrated circuits which are sold in packages having dimensions of two inches or less, it is increasingly important to test such parts at high speed in order to keep up with the production rates of such parts.

Such small electronic parts, such as integrated circuits at first were packaged in dual-in-line packages (DIPs), which are small, elongated plastic boxes with the leads coming out on either side of the box and turning down in two parallel rows along the package. As integrated circuits became smaller and more complex, the number of leads coming out of the package increased, even though the package size remained the same or decreased. One solution to this problem was the flat, plastic leadless chip carrier (PLCC), which typically is a small, flat square package having the leads coming out and formed around each of the four edges of the package. As integrated circuits became even more complex, even the PLCC was inadequate to carry all the leads required without making the part unreasonably large.

The most recent solution to the problem of putting a large number of leads on a small package is the pin grid array (PGA). These packages are generally flat and square, but have a large number of leads coming out of the bottom of the package, parallel to each other, but perpendicular to the bottom of the package. The PGA packages can contain pin counts on the order of 100 in a 10×10 array or 169 in a 13×13 array or even larger.

As with each new innovation in package, a system had to be worked out for testing the integrated circuits in the new PGA packages. Because the PGA packages had the leads coming straight out of the package, a scheme had to be devised for perpendicularly inserting the PGA packages one by one into a test site which would make electrical contact with each of the leads and the circuit could be put through its paces by test software.

Current attempts at designing test sites for PGA parts have proved unsatisfactory. One commercial test site employs a test site box having a plurality of offset contact wires rising from the bottom of the box to the top of the open-ended box in a rectilinear pattern to correspond to and register with the lead pins from a PGA part. The ends of the upraised wire contacts are bent slightly and designed to meet with and be slightly sprung by tiny pegs on the underside of the lid of the test site. The lead pins on the PGA part then penetrate through holes in the test site lid and come into offset contact with the slightly bent tips of the upraised contact wires. The bottom ends of the contact wires are exposed through the bottom of the test site so that connection could be made to a customary device-under-test (DUT) board and eventual contact with the host test computer.

This test site configuration has many problems which include the fact that all of the wires are firmly fixed into the test site so that if one of the wires is damaged, the entire test site has to be removed for repair. Because the wires, which are cast into the test site, must be precisely aligned, such test sites are very costly to produce. Also, it is extremely easy to bend one of the contact wires and once bent, it is difficult by visual inspection to tell which wire is damaged or out of alignment. This problem has the related effect that the test site will sometimes reject PGA parts as "bad" when in fact the part is good but did not make contact with the offset wires. Further, because the test site lid pegs must make precise contact with the tips of the contact wires and spring them into proper alignment, it is particularly difficult to put the lid on the test site properly.

SUMMARY OF THE INVENTION

Accordingly, it is an object of the present invention to provide an integrated circuit test site which contains pins for contacting the individual leads of the integrated circuit under test, which can be individually removed from the test site.

Another object of the present invention is to provide a test site that can be populated with only enough contact pins to do the testing job required and no more.

Still another object of the invention is to provide a test site for integrated circuits which will be easily repairable with a minimum of down time.

Yet another object of the present invention is to provide an integrated circuit test site where the individually removable contact pins come apart in an easily removable fashion to facilitate repair and replacement.

In carrying out these and other objects of the invention, there is provided, in one form, an integrated circuit test site lead receiving chamber. The lead receiving chamber has a parallel contact pin support shelf which in turn has a top surface and a plurality of contact pin support holes extending therethrough parallel to each other and normal to the top surface. The chamber also has a plurality of chamber walls surrounding and normal to the parallel contact pin support shelf. The walls have top surfaces which form a test site lid support surface parallel to the top surface of the contact pin support shelf.

DETAILED DESCRIPTION OF THE INVENTIONS

Figure 1:
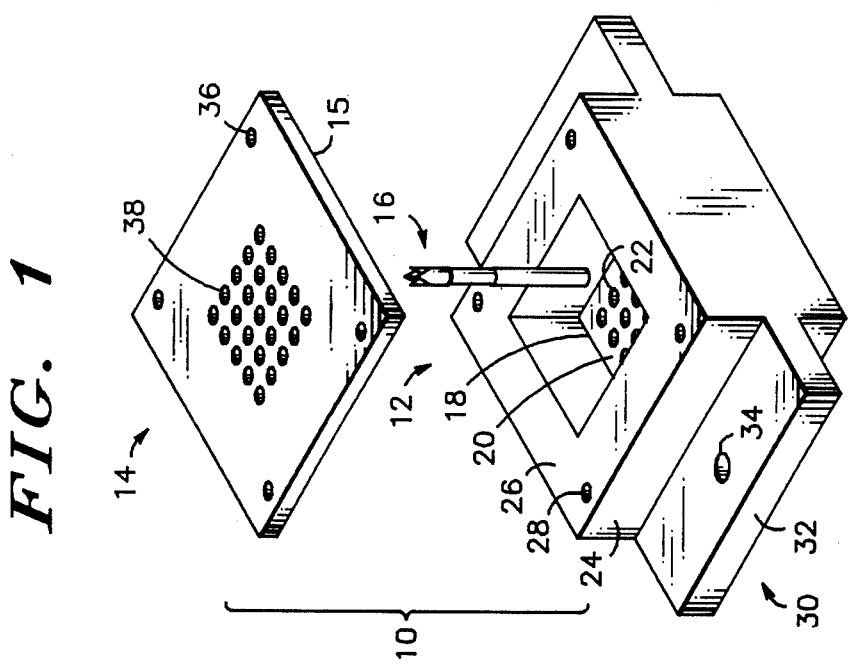
FIG. 1 is an exploded isometric view of the integrated circuit test site of this invention with the test site lid removed revealing a contact pin.

Shown in FIG. 1 is an isometric view of the integrated circuit test site 10 of this invention with the inside of integrated circuit lead receiving chamber 12 exposed by removal of the test site lid 14. An elongated contact pin 16 is also removed to demonstrate its orientation with respect to the lead receiving chamber 12 and the test site lid 14, as well as to show its removability. Although the metal terminals of a PGA package are typically called "pins", the term "lead" will be used herein to avoid confusion with the contact pins 16.

Also seen on the lead receiving chamber 12 of FIG. 1 is a parallel contact pin support shelf 18 having a top surface 20. A plurality of contact pin support holes 22 may be seen in top surface 20 of parallel contact pin support shelf 18. It should be noted that contact pin support holes 22 are oriented normal, or at a right angle, to the top surface 20 and completely pierce the parallel contact pin support shelf 18. As a result, the plurality of elongated contact pins 16 are held in a parallel orientation with respect to each other, but at a right angle to the top surface 20 of the support shelf 18. Typically, the contact pin support holes 22 are arranged in a square grid pattern to correspond to and register with the lead pattern on a PGA part. However, the invention should not be limited by a particular layout of the support holes 22, for such an arrangement would depend on whatever pattern exists on the PGA device to be tested.

The parallel contact pin support shelf 18 is surrounded by a plurality of chamber walls 24 having an orientation normal to the contact pin support shelf 18 and having top surfaces which form a test site lid support surface 26. Test site lid support surface 26 is preferably flat and designed to meet with the underside 15 of test site lid 14 and hold it in a parallel orientation with respect to contact pin support shelf 18 and hence the tops of contact pins 16. It will be understood that chamber walls 24 do not have to have the square arrangement shown in FIG. 1 and could be of rectangular, circular or other arrangement suitable to perform its function herein. In addition, test site lid support surface 26 may have a plurality of test site lid mounting holes 28 or other means well known in the art for removably mounting test site lid 14.

Integrated circuit lead receiving chamber 12 may also possess a test site mounting means 30, which may comprise a test site mounting bracket 32 having threaded mounting holes 34 or other suitable mounting means well known in the art.

Test site lid 14 is removably mounted upon test site lid support surface 26 by means of lid mounting holes 36 which correspond to test site lid mounting holes 28, or by other means, as mentioned. Test site lid 14 is also pierced by a plurality of device lead alignment holes 38 which correspond to and are registered with the contact pin support holes 22 of the contact pin support shelf 18. Once twenty-five device lead alignment holes 38 are shown in test site lid 14 which is an unusually low number for a pin grid array device. Ordinarily, the number of holes would be much larger, such as 100 for a 10×10 matrix or 169 for a 13×13 grid arrangement; fewer holes are shown in the Figures for the the sake of simplicity and clarity of the drawings.

Figure 2:
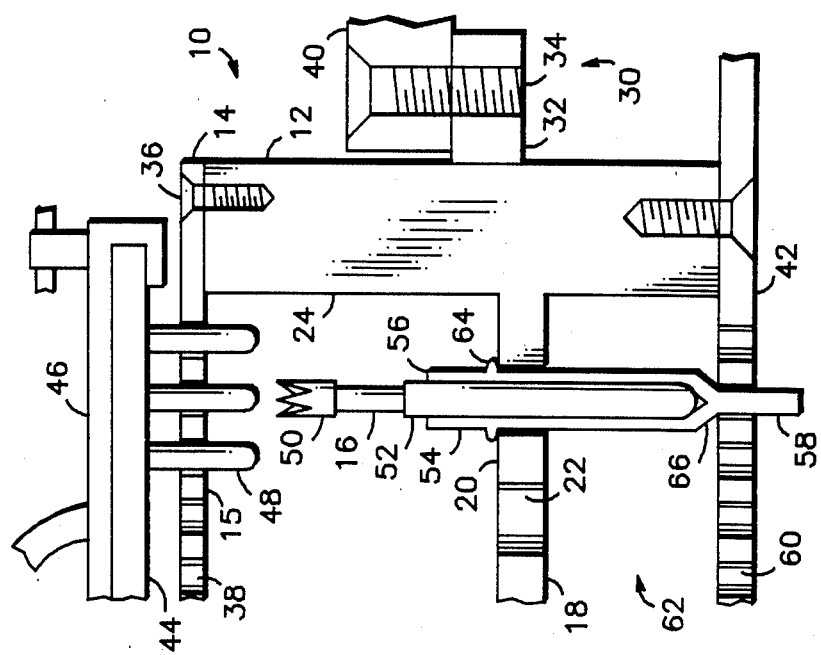
FIG. 2 is a partial section view of the integrated circuit test site of this invention as it might appear when in service testing PGA parts.

Shown in FIG. 2 is a more detailed partial sectional view of the integrated circuit test site assembly 10 as it might appear in actual use. Typically, test site assembly 10 would be mounted on an integrated circuit test handler frame 40, partially shown in FIG. 2. In addition, a device-under-test (DUT) board 42 would be removably mounted on the back of the receiving chamber 12 to permit electrical connection to the bottom end of the contact pins 16. DUT boards may be relatively simple printed circuit boards which enable alterable test connections to be made to a device under test and serve as the interface between the device and the hose computer running the test.

In operation, a PGA integrated circuit device 44 is inserted into the test site assembly 10 by a pneumatically operated plunger or flipper-type inserter 46, partially shown. The insertion device 46 may be of any type well-known in the art as long as the PGA package 44 is inserted vertically into the test site assembly 10. The PGA integrated circuit device 44 has a plurality of leads 48 which are inserted through device lead alignment holes 38 of test site lid 14 to contact the tops of the contact pins 16 which are held in an upright corresponding, registered position by contact pin support holes 22 of support shelf 18.

The lead receiving chamber 12 should be designed so that the distance from the top surface 20 of support shelf 18 to the test site lid support surface 26 is substantially the same as the distance between the top of pin contact head 50 and shoulder 64. The goal is that when contact pin 16 is inserted within lead receiving chamber 12, the contact head 50, when not touching PGA lead 48 is substantially at the level of test site lid support surface 26. In actual practice, if pogo pins are used, as hereinafter described, the tops of the contact pin heads 50 may be slightly below the plane of lid support surface 26, or if test site lid 14 is removed, slightly above this plane. In the latter situation, pogo pins 16 would be slightly sprung when test site lid 14 is removably installed. In FIG. 2 contact head 50 is partially retracted from its relaxed position substantially at the level of test site lid support surface 26, or the level of the underside 15 of the test site lid 14, which are identical when assembled. The contact head 50 is partially retracted for clarity of illustration and would, in actual practice, be contacting one of the PGA lead 48.

Preferably, the contact pins 16 are "pogo" pins, so-called because the contact head 50 rides up and down on a tiny spring within the pogo pin housing 52. Pogo pins are well-known in the art and the present invention may use any of the varieties available as long as contact pin support holes 22 are sized accordingly. Electronic sockets with non-removable spring-loaded contact pins are known, such as the one described in U.S. Pat. No. 4,508,405 to Damon. The preferred type of pogo pins have a spiked contact head 50 as shown in the Figures, so that as dust, etc. or material slightly scraped off the PGA leads 48 when the contact pins 16 touch the PGA leads 48, the extraneous matter falls off the contact head 50. In other designs, such as the cup-shaped contact head, such extraneous matter is retained in the contact head and in time interferes with a good electrical contact with the leads 48. Gold-on-gold pins are preferred over nickel on steel or other designs because of their durability and electrical properties. It had previously been thought in the art that pogo pins would be unsuitable for high speed testing of integrated circuits. However, it has been discovered that they are much improved over the sprung wire contact systems discussed above. The sprung wire contact systems could barely be tested at 1 MHz at 25° C. whereas the gold-on-gold pogo pins can be used at tests of at least 15 MHz at 150° C., if not more severe.

Optionally, the contact pins 16 may reside in contact pin receiving sleeves 54 which have an open end 56 and a closed end 58. Preferably, the dimensions of the test site assembly 10 are such that either the bottom ends of the contact pins 16 or the closed ends 58 of the receiving sleeves 54 extend through a plurality of pin connection holes 60 in the DUT board 42 so that the contact pins 16 may be electrically connected via soldering, wire wrapping or other means to the host test computer. Of course, pin connection holes 60 must also correspond to and register with the pattern of contact pin support holes 22 of the support shelf 18. Optionally, integrated circuit lead receiving chamber 12 may have a contact pin receiving sleeve closed end recess 62 beneath parallel contact pin support shelf 18. Recess 62 will permit the closed ends 58 of receiving sleeves 54 to move or flex laterally slightly so that they may be more readily inserted into pin connection holes 60 of DUT board 42.

Receiving sleeves 54 may be designed to have a shoulder 64 so that the contact heads 50 of the contact pins 16 are at the proper height with respect to the bottom of the test site lid 14. Ideally, when a PGA device is not inserted into the test site assembly 10, the contact heads 50 should be slightly below or right at the underside 15 of the test site lid 14 or even slightly above this level when the lid 14 is removed and pogo pins are used to insure that all of the contact heads 50 are at the same height, as noted above. In addition, the receiving sleeves 54 may have a lower shoulder 66 in case shoulder 64 fails or is maladjusted so that the receiving sleeves 54 would be stopped in their downward travel by coming up against the top surface of the DUT board 42.

Thus, under the operation of this invention using a test site assembly 10 populated with pogo pins, the PGA inserter 46 would insert a PGA integrated circuit device 44 into the test site assembly 10 by passing the PGA leads 48 through device lead alignment holes 38 of test site lid 14. The PGA leads 48 would then contact and press against contact pin 16 contact heads 50. The PGA device 44 would not have to be inserted very far into the test site assembly 10, that is, the bottom of the PGA device 44 does not have to touch test site lid 14, as long as all of the PGA leads 48 make electrical contact with their corresponding contact pins 16. Electrical contact would thus be made along the contact pins 16 to the DUT board 42 and ultimately to the host computer for test. As the PGA device 44 was removed from the test site assembly 10 by the PGA inserter 46, pogo contact pins 16 would help push the device 44 out of the test site assembly 10, if spring-loaded pogo pins were used. The entire transaction would take on the order of a second or less.

A number of advantages of the invention may be seen herein. For example, the removable nature of the contact pins 16 may be appreciated. If one of the contact pins 16 were damaged, it could be easily identified and replaced for repair by only removing test site lid 14 instead of by disconnecting the entire test site assembly 10 as required by prior art devices. To be removable, a snug fit between the contact pins 16 and support shelf 18 is required, or between contact pin receiving sleeves 54 and support shelf 18 if receiving sleeves 54 are used.

Attention must be paid to the material that integrated circuit lead receiving chamber 12 is made out from. Ideally it would be some material which contact pins 16 or receiving sleeves 54 could slip in and out when force is applied but which would otherwise hold them in place. Many plastics are anticipated as being suitable to perform this function, such as nylon-6,6, and this invention is not limited to any one material. It is also evident that the integrated circuit lead receiving chamber 12 and test site lid 14 should be made out of electrically insulative material. The nylon-6,6 material, mentioned earlier is certainly suitable, although other substances could certainly be used as long as they were electrically insulative and, in the case of integrated circuit lead receiving chamber 12, capable of being fabricated so that elongated contact pins 16 or receiving sleeves 54 may be slidably removable therefrom. Of course, contact pins 16 and sleeves 54 must be electrically conductive.

It may also be noted that if the particularly PGA device 44 being tested does not have the entire pin grid array filled with lead pins, say only eighty-four leads are present around the perimeter of a 10×10 array, then the test site assembly 10 need only be filled or populated with contact pins 16 in those eighty-four support holes 22 corresponding to the PGA device 44 pin pattern.

Another advantage of the present invention is that connection between the PGA leads 48 and the contact pins 16 is more readily assured since the connection is direct rather than offset as seen in prior designs. In other words, a slight misalignment will not throw off the electrical connection when the test site of this invention is used unlike the device wherein offset wire contacts are employed. Thus, the likelihood of a good device being tested as "bad" are greatly decreased.

We claim:

1. An integrated circuit test site assembly for temporarily housing and contacting the leads of integrated circuits packaged in individual pin grid arrays (PGAs) during a test when the test site assembly is attached to an integrated circuit testing handler, the test site assembly comprising
   an integrated circuit lead receiving chamber for receiving the leads of an integrated circuit packaged in an individual PGA, comprising
     a contact pin support shelf having a top surface thereof having therein a plurality of contact pin support holes oriented normal to the top of the surface of the contact pin support shelf,
     a plurality of chamber walls surrounding and normal to the contact pin support shelf having top surfaces which form a test site lid support surface having a level at some distance above the top surface of the parallel contact pin support shelf,
     a plurality of contact pin receiving sleeves individually and removably mounted into the contact pin support holes, the contact pin receiving sleeves each having a shoulder at a predetermined point along their length to meet with the top surface of the contact pin support shelf,
     a plurality of elongated contact pins having tops individually and removably mounted into the contact pin receiving sleeves such that the tops of the contact pins are immediately below and proximate to an underside of
   a test site lid removably mounted upon the test site lid support surface, being parallel to the top surface of the contact pin support shelf, having a plurality of device lead alignment holes corresponding to, registered with and above the tops of the elongated contact pins, said holes for aligning the leads of a PGA with the tops of the elongated contact pins to make electrical contact therewith, but wherein the elongated contact pins are adapted to never enter the device alignement holes in the test site lid.

2. The integrated circuit test site assembly of claim 1 in which the integrated circuit lead receiving chamber further comprises test site mounting means for mounting the test site assembly to an integrated circuit testing handler.

3. The integrated circuit test site assembly of claim 1 in which the elongated contact pins are spring-loaded contact pins.

4. The integrated circuit test site assembly of claim 1 in which a device-under-test board is removably mounted to the integrated circuit lead receiving chamber.

5. The integrated circuit test site assembly of claim 4 in which the plurality of elongated contact pin receiving sleeves, each have an open end and a closed end, the contact pin receiving sleeves being individually removably mounted into the contact pin support holes with the open ends of the receiving sleeves facing the test site lid and the closed ends passing through a plurality of sleeve terminal holes in the device-under-test board which correspond to and are registered with the contact pin support holes of the contact pin support shelf.

6. The integrated circuit test site assembly of claim 1 in which the integrated circuit lead receiving chamber has a contact pin receiving sleeve closed end recess beneath the parallel contact pin support shelf.

7. An integrated circuit test site assembly for temporarily housing and contacting the leads of integrated circuits packaged in individual pin grid arrays (PGAs) during a test when the test site assembly is attached to an integrated circuit testing handler, the test site assembly comprising an integrated circuit lead receiving chamber for receiving the leads of an integrated circuit packaged in an individual PGA, comprising a contact pin support shelf having a top surface thereof having therein a plurality of contact pin support holes oriented normal to the top of the contact pin support shelf which completely pierce the support shelf, and a plurality of chamber walls surrounding and normal to the contact pin support shelf having top surfaces which form a test site lid support surface having a level at some distance above the top surface of the parallel contact pin support shelf, a plurality of contact pin receiving sleeves individually and removably mounted into the contact pin support holes, the contact pin receiving sleeves each having a shoulder at a predetermined point along their length to meet with the top surface of the contact pin support shelf, a plurality of elongated spring-loaded contact pins individually and removably mounted into the contact pin receiving sleeves such that the tops of the contact pins are at the level of the test site lid support surface, a test site lid removably mounted upon the test site lid support surface, being parallel to the top surface of the contact pin support shelf, having a plurality of device lead alignment holes corresponding to, registered with and above the tops of the elongated contact pins, said holes for aligning the leads of a PGA with the tops of the elongated contact pins to make electrical contact therewith, but wherein the elongated contact pins are adapted to never enter the device alignment holes in the test site lid, instead wherein the tops of the contact pins travel only within the lead receiving chamber, and test site mounting means for mounting the test site assembly to an integrated circuit testing handler.

8. The integrated circuit site assembly of claim 7 in which a device-under-test board is removably mounted on the integrated circuit lead receiving chamber.

9. The integrated circuit test site assembly of claim 8 in which the plurality of elongated contact pin receiving sleeves, each have an open end and a closed end, the contact pin receiving sleeves being individually removably mounted into the contact pin support holes with the open ends of the receiving sleeves facing the test site lid and the closed ends passing through a plurality of sleeve terminal holes in the device-under-test board which correspond to and are registered with the contact pin support holes of the contact pin support shelf.

10. The integrated circuit test site assembly of claim 7 in which the integrated circuit lead receiving chamber has a contact pin receiving sleeve closed end recess beneath the contact pin support shelf.

* * * * *